US009461551B2

(12) United States Patent
Pahlevaninezhad et al.

(10) Patent No.: US 9,461,551 B2
(45) Date of Patent: Oct. 4, 2016

(54) CURRENT SENSORLESS MPPT FOR PV MICRO-INVERTERS

(71) Applicants: Majid Pahlevaninezhad, Kingston (CA); Praveen Jain, Kingston (CA); Shangzhi Pan, Kingston (CA)

(72) Inventors: Majid Pahlevaninezhad, Kingston (CA); Praveen Jain, Kingston (CA); Shangzhi Pan, Kingston (CA)

( * ) Notice: Subject to any disclaimer, the term of this patent is extended or adjusted under 35 U.S.C. 154(b) by 0 days.

(21) Appl. No.: 14/841,195

(22) Filed: Aug. 31, 2015

(65) Prior Publication Data

US 2016/0126847 A1    May 5, 2016

Related U.S. Application Data

(60) Provisional application No. 62/073,431, filed on Oct. 31, 2014.

(51) Int. Cl.

| | | |
|---|---|---|
| *H02M 3/335* | (2006.01) | |
| *H02S 40/32* | (2014.01) | |
| *H02S 40/34* | (2014.01) | |
| *G01R 19/00* | (2006.01) | |
| *G01R 21/133* | (2006.01) | |
| *G01R 31/40* | (2014.01) | |
| *H02M 3/337* | (2006.01) | |
| *H02J 3/38* | (2006.01) | |
| *H02M 1/00* | (2006.01) | |

(52) U.S. Cl.
CPC ...... *H02M 3/33507* (2013.01); *G01R 19/0092* (2013.01); *G01R 21/133* (2013.01); *H02J 3/385* (2013.01); *H02M 3/3376* (2013.01); *H02S 40/32* (2014.12); *H02S 40/34* (2014.12); *H02S 50/00* (2013.01); *H02M 2001/0009* (2013.01); *H02M 2001/0058* (2013.01)

(58) Field of Classification Search
CPC ............... H02M 3/33569; H02M 2007/4815; H02M 3/33507; H02S 40/34; H02S 40/32; G01R 19/0092; H02J 3/385
USPC ........ 323/906; 363/15–17, 20–21.02, 95, 97, 363/98, 131, 132
See application file for complete search history.

(56) References Cited

U.S. PATENT DOCUMENTS

| | | | |
|---|---|---|---|
| 7,952,897 B2 * | 5/2011 | Nocentini ............. | H02M 3/156 323/906 |
| 8,279,649 B2 | 10/2012 | Esram et al. | |
| 8,284,574 B2 | 10/2012 | Chapman et al. | |
| 8,325,499 B2 | 12/2012 | Krein et al. | |
| 8,503,200 B2 | 8/2013 | Chapman et al. | |
| 8,611,107 B2 | 12/2013 | Chapman et al. | |
| 8,704,499 B2 | 4/2014 | Escobar et al. | |

(Continued)

FOREIGN PATENT DOCUMENTS

| | | |
|---|---|---|
| EP | 2503427 A1 | 9/2012 |
| EP | 2431832 B1 | 5/2013 |
| EP | 2658109 A1 | 10/2013 |

*Primary Examiner* — Gary L Laxton
*Assistant Examiner* — Kyle J Moody
(74) *Attorney, Agent, or Firm* — Brion Raffoul

(57) ABSTRACT

Systems, methods, and devices for use with photovoltaic micro-inverters. A control system for controlling power switches in a full bridge inverter in a DC/DC converter uses an estimate of the output current of a photovoltaic (PV) panel. The estimate is provided by a current estimator that takes as input the output voltage of the PV panel as well as the bus voltage of the DC/DC converter. Also used as input to the current estimator are two of the control signals for specific power switches in the full bridge inverter in the DC/DC converter.

6 Claims, 16 Drawing Sheets

(56) References Cited

U.S. PATENT DOCUMENTS 8,737,100 B2 5/2014 Chapman et al.
2015/0138841 A1* 5/2015 Pahlevaninezhad .. H02M 3/337
  363/17
2015/0280610 A1* 10/2015 Pahlevaninezhad .. H02M 7/537
  363/131

* cited by examiner

CURRENT SENSORLESS MPPT FOR PV MICRO-INVERTERS

RELATED APPLICATIONS

This application is a non-provisional of U.S. Provisional Patent Application No. 62/073,431 filed Oct. 31, 2014.

TECHNICAL FIELD

The present invention relates to circuit and control systems for photovoltaic (PV) micro-inverters. In particular, the present invention relates to methods, circuits, and devices for use with PV micro-inverters and for maximum power point tracking (MPPT) of PV panels.

BACKGROUND

Photovoltaic (PV) power conditioning systems usually include a maximum power point tracker (MPPT) in order to ensure that the maximum available power is extracted from the PV panels. The PV power conditioning system usually consists of two stages. The first stage is a DC/DC converter. The second stage is usually a DC/AC inverter. The DC/DC converter is responsible for providing galvanic isolation as required by grid interconnection regulatory standards. The DC/DC converter also boosts the voltage at the output of the PV panel. As well, the DC/DC converter control system is responsible for extracting the maximum power from the PV panel. The DC/AC converter converts the DC power to AC power which can be delivered to the utility grid.

FIG. 1 shows an exemplary arrangement of a two-stage PV power conditioning system. In FIG. 1, illustrated are: a PV power conditioning system 1, a PV-panel 2, a DC/DC converter 3, a DC-link 4, a DC/AC converter 5, and a utility grid 6. The DC/DC converter 3 performs the maximum power point tracking of the PV-panel 2. Also, present is an intermediate DC-link 4 between the two stages of the power conditioning system. This component is used so that energy can be stored and to provide decoupling between the first-stage and the second-stage of the system. As well, the DC-link 4 attenuates the double frequency ripple caused by the power ripple at the output of second-stage DC/AC converter 5. The DC/AC converter 5 produces power compatible to the utility grid 6.

The arrangement in FIG. 2 shows an exemplary arrangement of the DC/DC converter control system. This figure shows that the control DC/DC converter control system 30, includes: maximum power point tracker (MPPT) 32, and DC/DC converter controller 34. The MPPT 32 produces the reference value for the PV voltage/current according to the feedback signals. These feedback signals are the PV output voltage $v_{PV}$ and the PV output current $i_{PV}$. The MPPT 32 requires both the PV output voltage and current in order to find the "maximum power point". With the PV output voltage $v_{PV}$, and the PV output current $i_{PV}$, the MPPT 32 produces the reference value for either the PV output voltage, $V^*_{PV}$, or the PV output current, $i^*_{PV}$. This reference is the input to the DC/DC converter controller 34. The DC/DC converter controller 34 produces appropriate gate pulses for the DC/DC converter in order to regulate the converter input voltage or the converter input current.

In order to measure the output current of the PV panel, a current sensor able to measure direct current (DC) is required. Two types of current sensors are commonly used to measure this DC current: Hall-effect current sensors, and resistive current sensors.

Hall effect sensors suffer from several practical difficulties. Due to the remnant flux, such Hall effect sensors introduce a time varying DC-bias into the control system. A correction algorithm therefore has to be added to compensate for this time varying DC bias. This correction algorithm increases the complexity of the implementation of the control system and reduces the reliability of the converter. As well, the bandwidth of the Hall effect sensors are limited and they introduce delay into the closed-loop control system. Such delay may jeopardise the stability of the control system. Finally, Hall effect sensors are very costly and can significantly contribute to the overall cost of the converter.

The second technique to measure the input current is through the use of resistive current sensors. Resistive current sensors require a very precise and noise-free differential amplifier. These types of sensors also increase the power losses of the converter. These power losses are not preferable due to the efficiency deterioration and thermal management. The arrangement in FIG. 3 shows an exemplary arrangement of the resistive current sensor used to measure the output current of a PV panel. Referring to FIG. 3, illustrated are: a resistive current sense 36, a precise difference amplifier 38, and an analogue-to-digital converter (ADC) 40. This circuitry in FIG. 3 produces the digital value of the PV panel output current for the MPPT 32. According to FIG. 3, the resistive current sensor requires a precise difference amplifier in order to accurately measure the current. Also, at light loads the accuracy of the resistive current sensor is highly compromised due to the small value of the current sense resistor $R_{sense}$. Therefore, at light loads the performance of MPPT is significantly deteriorated.

For multi-input PV power conditioning systems, in particular, the input current sensors add a lot of complexity and cost to the power conditioning system. The arrangement in FIG. 4 shows an exemplary arrangement of a four-input PV power conditioning system. This power conditioning system is able to perform maximum power point tracking on each individual panels. However, the power conditioning system is required to measure each PV panel's output current in order to perform maximum power point tracking. The power conditioning system therefore requires current sense resistors, difference amplifiers and ADCs for each individual panel. Because of this, current sensors significantly contribute to the overall cost of the power conditioning system.

In addition to the above, there is another difficulty related to using resistive current sensors for multi-input power conditioning systems. The arrangement in FIG. 5 shows the multi-input PV power conditioning system with resistive current sensors. In order to minimize the required isolation circuitry for the DC/DC converter, the control system should have the same ground as the control system. This is because gate pulses produced by the control system can be directly applied to the DC/DC converters power switches without isolation. However, in this arrangement, the multiple inputs of the power conditioning system cannot operate in parallel, since the current sense resistors will be in parallel and cannot indicate the precise value of the current for each panel. This difficulty restricts the application of the multi-input PV power conditioning systems for different applications. In particular, this arrangement cannot be applied to applications where the PV panels are arranged in parallel.

There is therefore a need for a simple and practical solution which can provide the output current information for the PV panel. Preferably, such a solution should not add extra circuitry to the power conditioning system. It would also be preferable if such a solution can provide the current information very precisely and reliably under different conditions.

SUMMARY

The present invention provides systems, methods, and devices for use with photovoltaic micro-inverters. A control system for controlling power switches in a full bridge inverter in a DC/DC converter uses an estimate of the output current of a photovoltaic (PV) panel. The estimate is provided by a current estimator that takes as input the output voltage of the PV panel as well as the bus voltage of the DC/DC converter. Also used as input to the current estimator are two of the control signals for specific power switches in the full bridge inverter in the DC/DC converter.

In one aspect, the present invention provides a control system for controlling a DC/DC converter for a photovoltaic panel, the control system comprising:
- a current estimator for providing an estimated output current of said photovoltaic panel, said current estimator basing said output current on an output voltage of said photovoltaic panel and on a bus voltage of said DC/DC converter;
- a maximum power point tracker (MPPT) for producing a reference value for an output voltage for said photovoltaic panel, said MPPT receiving said estimated output current from said current estimator;
- an input voltage controller for producing a desired phase shift for regulating an input voltage of said DC/DC converter, said input voltage controller receiving said reference value from said MPPT;
- a phase-shift modulator for producing control signals for power switches in said DC/DC converter based on said desired phase shift;

wherein said current estimator is based on nonlinear dynamics of said DC/DC converter.

BRIEF DESCRIPTION OF THE DRAWINGS

The embodiments of the present invention will now be described by reference to the following figures, in which identical reference numerals in different figures indicate identical elements and in which.

DETAILED DESCRIPTION

In one aspect, the present invention relates to a current sensorless MPPT for PV power conditioning systems. The technique of the invention eliminates the need for current sense circuitry for measuring the output current of PV panels. As well, the technique of the invention can precisely estimate the output current of the PV panel for maximum power point tracking. The technique can greatly reduce the power conditioning system circuitry and, in turn, can reduce the overall cost of the power conditioning system. Additionally, the technique of the invention is not sensitive to the operating condition of the power conditioning system. Thus, this aspect of the invention can precisely estimate the current for different load conditions.

Figure 1:
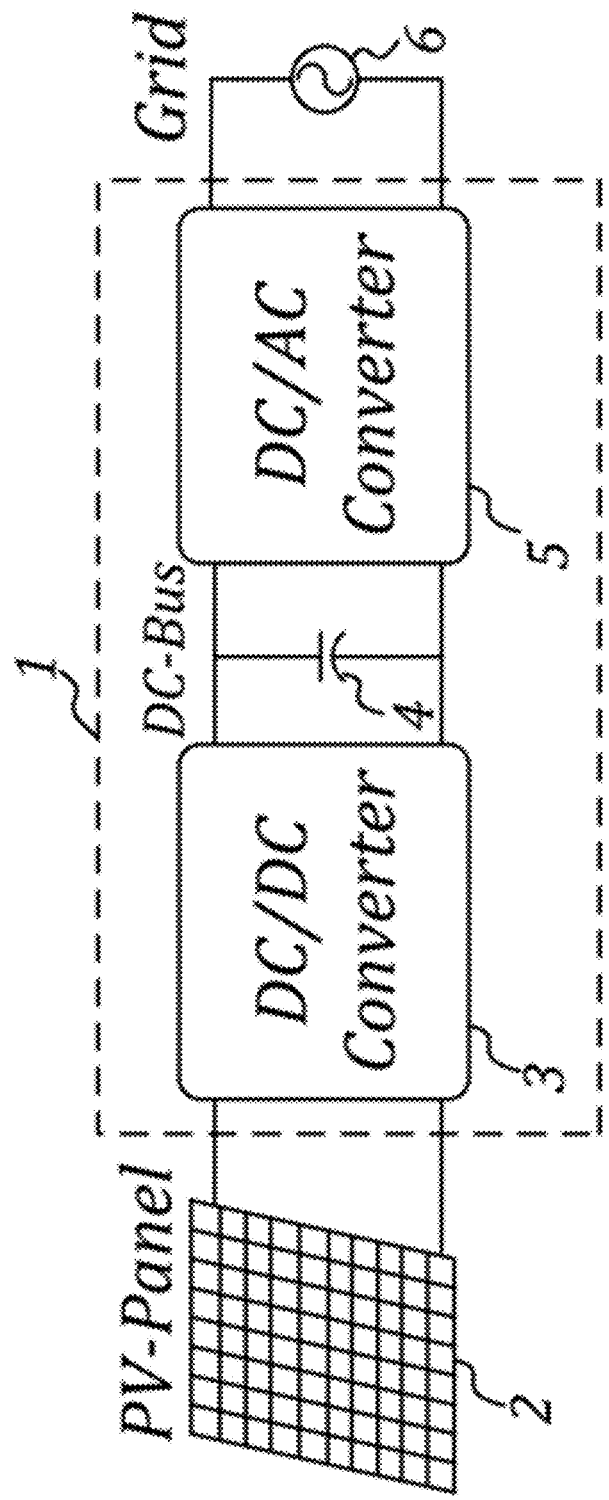
FIG. 1 shows an exemplary arrangement of a two-stage PV power conditioning system according to the prior art.
Figure 2:
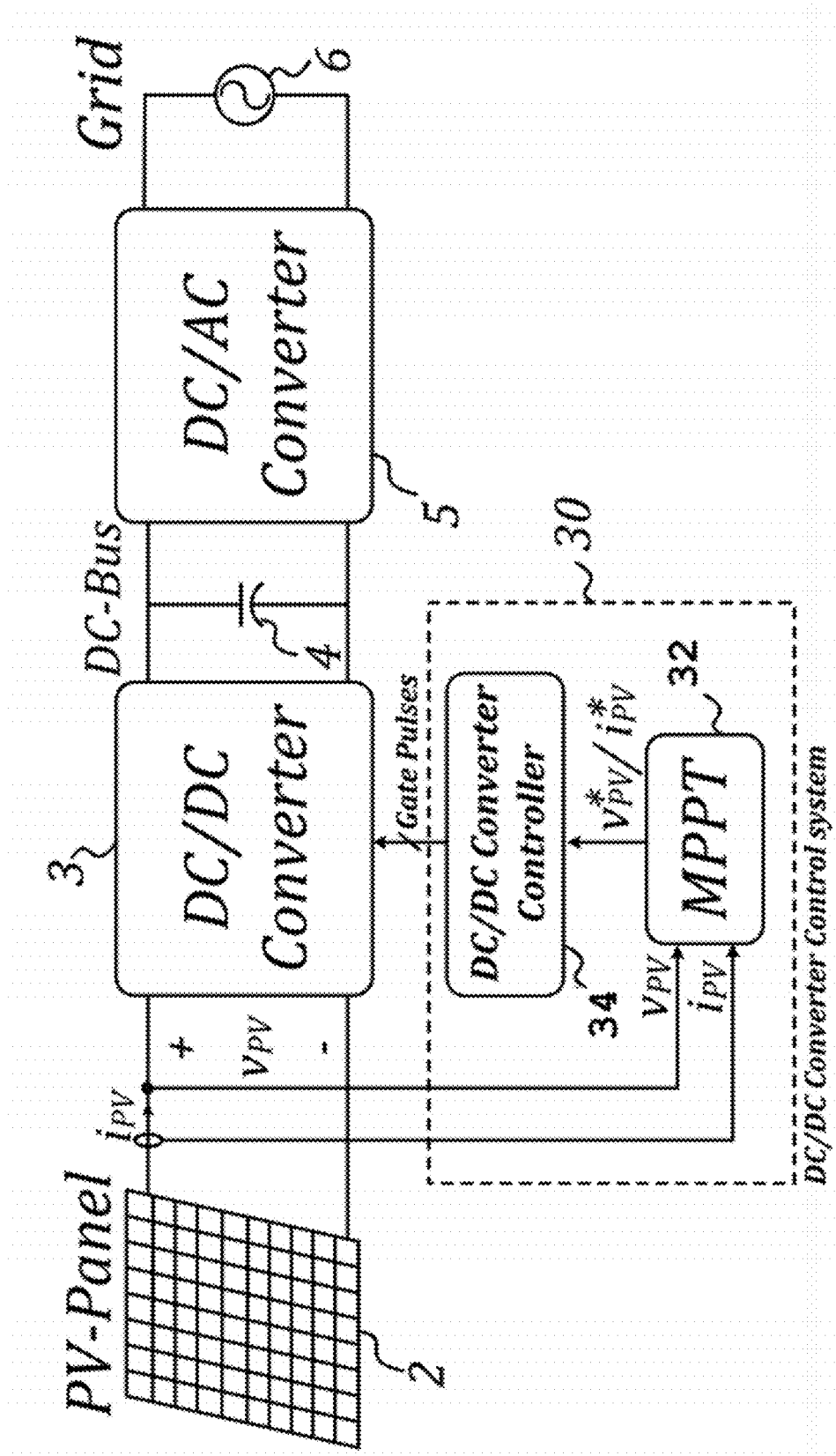
FIG. 2 shows an exemplary arrangement of the DC/DC converter control system according to the prior art.
Figure 3:
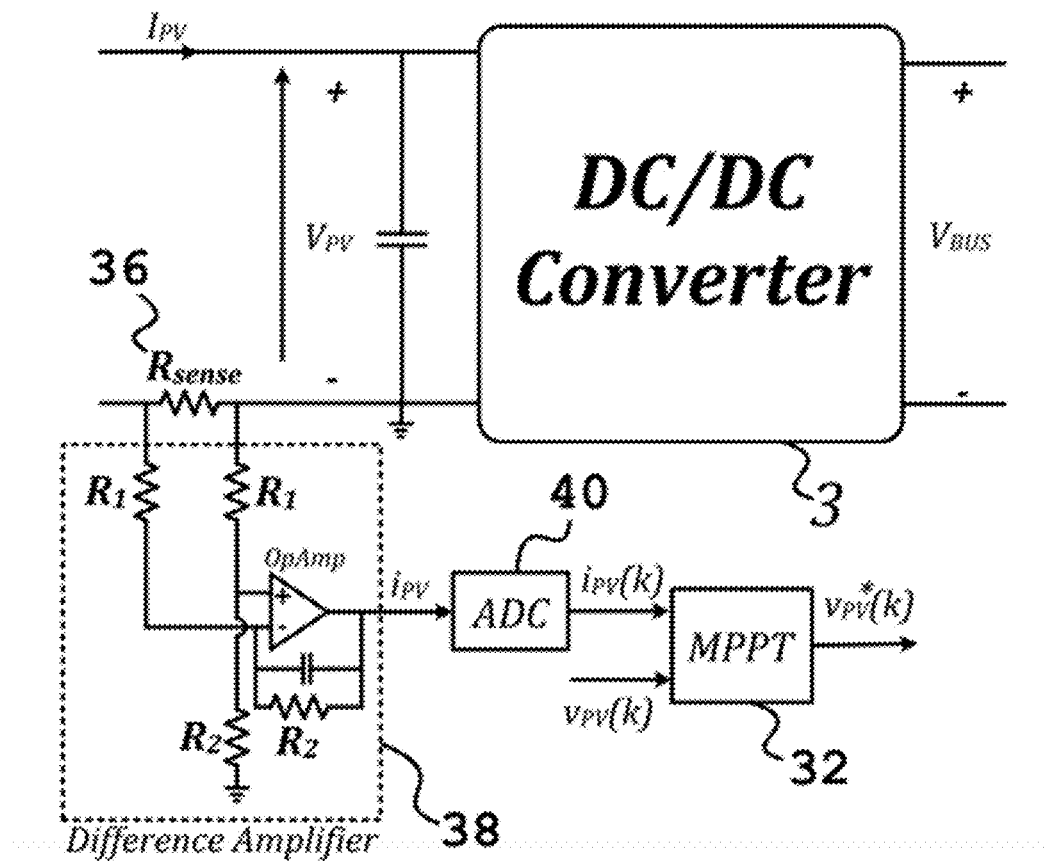
FIG. 3 shows an exemplary arrangement of the resistive current sensor used to measure the output current of a PV panel according to the prior art.
Figure 4:
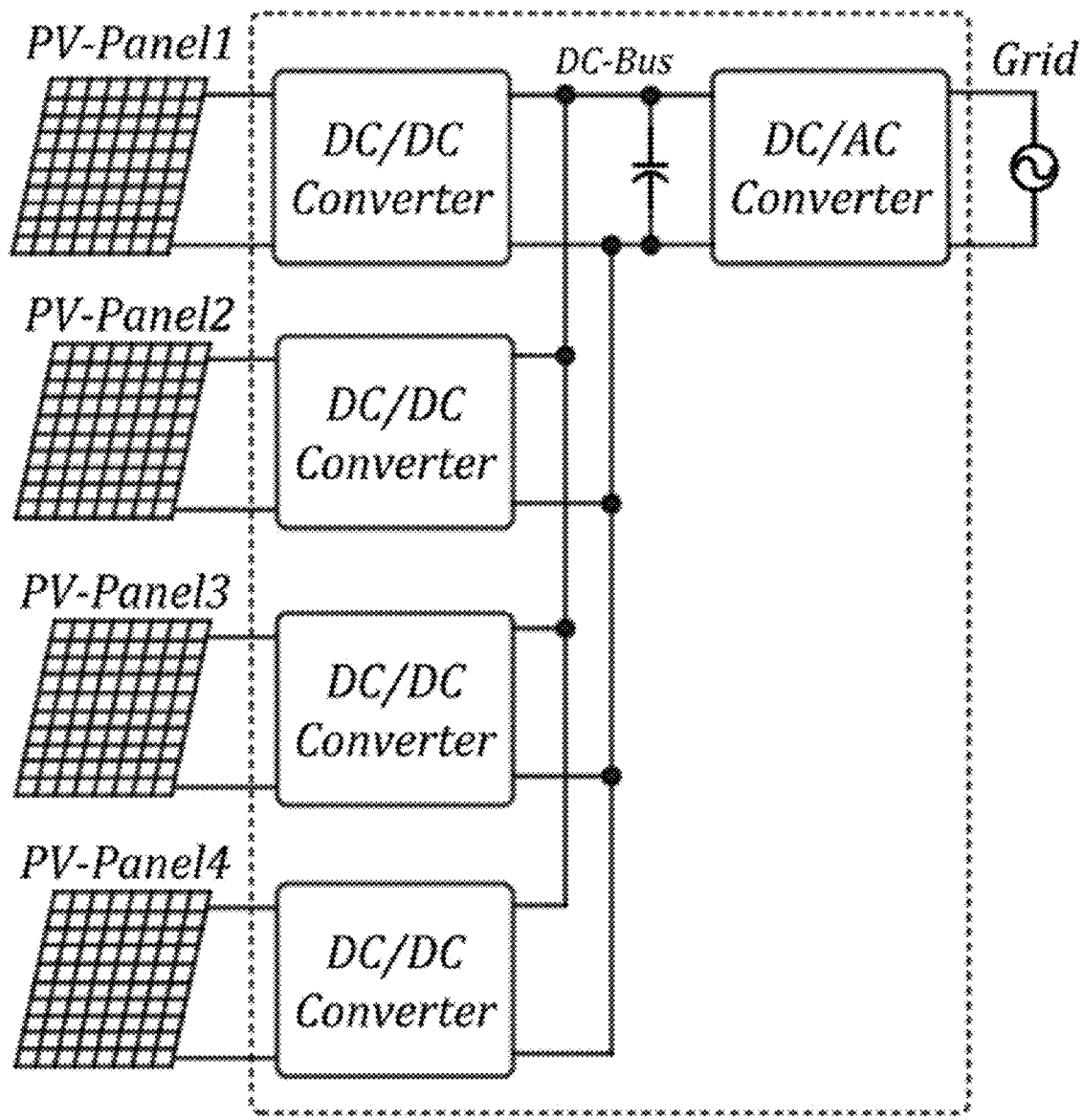
FIG. 4 shows an exemplary arrangement of a four-input PV power conditioning system according to the prior art.
Figure 5:
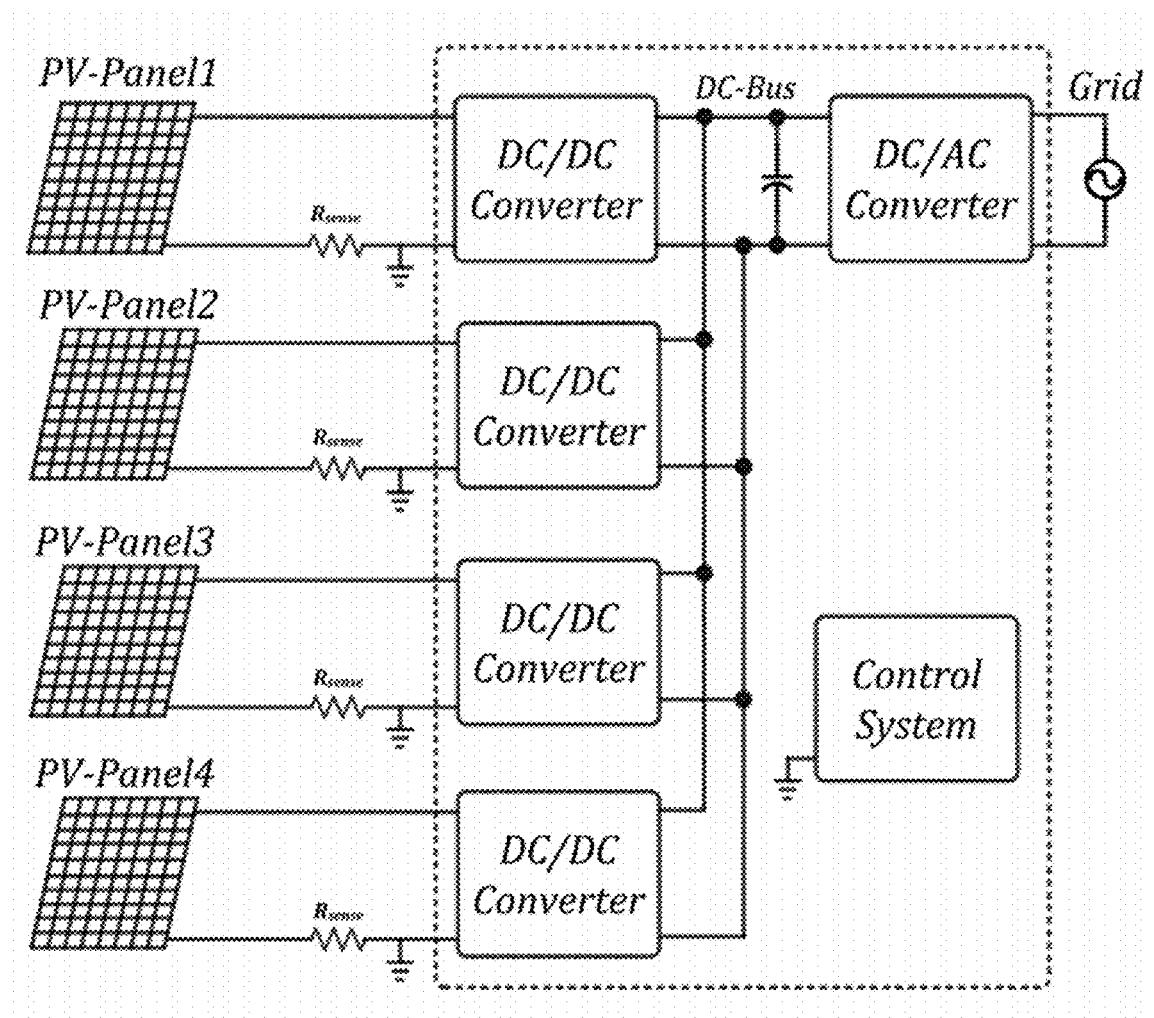
FIG. 5 shows the multi-input PV power conditioning system with resistive current sensors according to the prior art.
Figure 6:
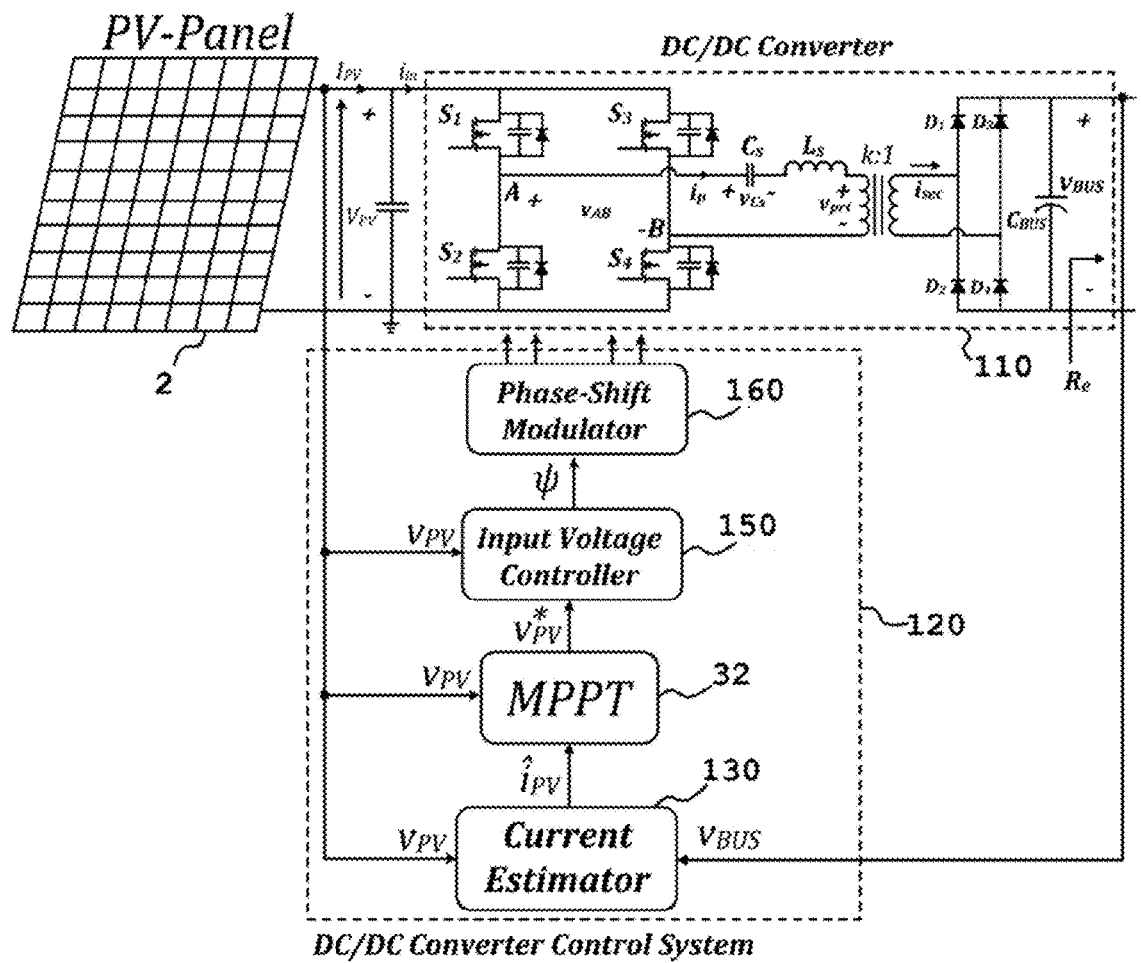
FIG. 6 illustrates a PV power conditioning system with a current sensorless MPPT according to one aspect of the invention.

The arrangement in FIG. 6 shows a system according to one aspect of the invention. In FIG. 6, a PV power conditioning system 100 with the current sensorless MPPT is illustrated. Referring to FIG. 6, illustrated are: a DC/DC converter 110, and a DC/DC converter control system 120. The DC/DC converter 110 is a series resonant converter. The DC/DC converter control system 120 includes a current estimator 130, an MPPT 32, an input voltage controller 150, and a phase-shift modulator 160. The current estimator 130 estimates the output current of the PV panel using the output voltage of the PV panel and the DC-bus voltage. The estimated current and the PV output voltage are applied to the MPPT 32. The MPPT 32 produces the reference value for the PV panel output voltage, $v^*_{PV}$. This reference value is sent to the input voltage controller 150. The input voltage controller 150 produces the appropriate phase-shift, $\psi$ in order to regulate the input voltage of the DC/DC converter. The phase-shift $\psi$ is sent to the phase-shift modulator 160 and the phase-shift modulator 160 generates the gate pulses for the power switches $S_1$-$S_4$ according to the inserted phase-shift $\psi$.

The current estimator is designed based on the DC/DC converter mathematical dynamics. According to FIG. 6, the dynamics of the DC/DC converter 110 are given by:

$$\frac{di_p}{dt} = \frac{1}{L_s}v_{AB} - \frac{1}{L_s}v_{CS} - \frac{1}{L_s}\text{sign}(i_p)v_{BUS} \quad (1)$$

$$\frac{dv_{Cs}}{dt} = \frac{1}{C_s}i_p \quad (2)$$

$$\frac{dv_{BUS}}{dt} = \frac{1}{C_{BUS}}|i_p| - \frac{1}{C_{BUS}R_e}v_{BUS} \quad (3)$$

According to Eqn. (1), Eqn. (2), and Eqn. (3), the dynamics of the DC/DC converter describe a nonlinear system. These nonlinear dynamics presents one of the main difficulties in designing a current estimator for these systems. It should be noted that the dynamics given by Eqn. (1), Eqn. (2), Eqn. (3) represent a very precise model of the converter compared to the average model or the fundamental equivalent model.

The objective is to design an observer which is able to estimate the output current of the PV panel or, more precisely, the output current of the PV panel in the DC component of the DC/DC converter input current, $i_{in}$.

Since the DC/DC converter input current, $i_{in}$, can be derived from the series resonant current, $i_p$, the objective becomes one of estimating the series resonant current $i_p$ using the dynamics given by Eqn. (1), Eqn. (2), and Eqn. (3). The only measurable state variable in these dynamics is the DC-bus voltage, $v_{BUS}$. Therefore, the system dynamics can be rewritten as:

$$\Sigma_{SRC}: \begin{cases} \dot{X} = f(X) + g \cdot u(t) \\ y = h = x_3 \end{cases} \quad (4)$$

where $$f(X) = \begin{pmatrix} f_1 \\ f_2 \\ f_3 \end{pmatrix} = \begin{pmatrix} -\frac{1}{L_s}x_2 - \frac{1}{L_s}\text{sign}(x_1)x_3 \\ \frac{1}{C_s}x_1 \\ \frac{1}{C_{BUS}}|x_1| - \beta x_3 \end{pmatrix}$$

$$X = \begin{pmatrix} x_1 \\ x_2 \\ x_2 \end{pmatrix} = \begin{pmatrix} i_p \\ v_{Cs} \\ v_{BUS} \end{pmatrix}$$

$$g = \begin{pmatrix} \frac{1}{L_s} \\ 0 \\ 0 \end{pmatrix}$$

$$\beta = \frac{1}{C_{BUS}R_e},$$

and $u(t) = v_{AB}$.

In order to design an observer for $x_1 = i_p$, the observability of the system with respect to the specified measurable output, $y = h = x_3 = v_{BUS}$, should be confirmed. The observability of the nonlinear system is examined by using the Lie derivative of the measurable output with respect to the system vector field, f. In particular, the rank of the following matrix determines the observability of the nonlinear system:

$$O = \begin{pmatrix} \nabla L_f^0(h) \\ \nabla L_f^1(h) \\ \nabla L_f^2(h) \end{pmatrix} = \begin{pmatrix} 0 & 0 & 1 \\ \frac{1}{C_{BUS}}\frac{x_1}{|x_1|} & 0 & \beta \\ \frac{\beta}{C_f}\frac{x_1}{|x_1|} & -\frac{1}{C_f L_s}\frac{x_1}{|x_1|} & -\frac{1}{C_f L_s}\text{sign}(x_1)\frac{x_1}{|x_1|} - \beta^2 \end{pmatrix} \quad (5)$$

According to Eqn. (5), the system is observable with $v_{BUS}$ as the only measurable state everywhere except $x_1 = 0$.

Figure 7:
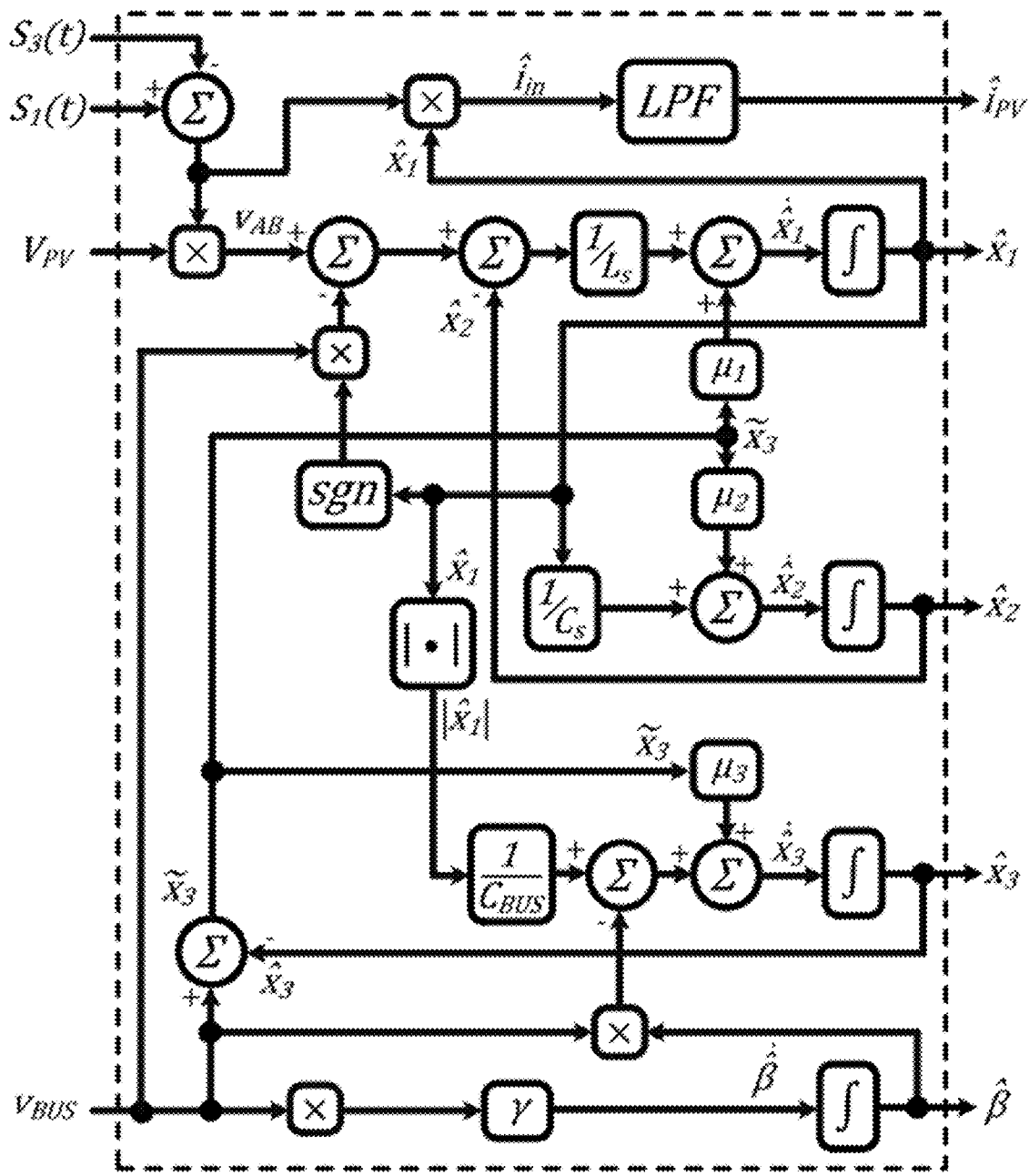
FIG. 7 illustrates the circuit implementing the current observer for the output current of PV panel.
Figure 8:
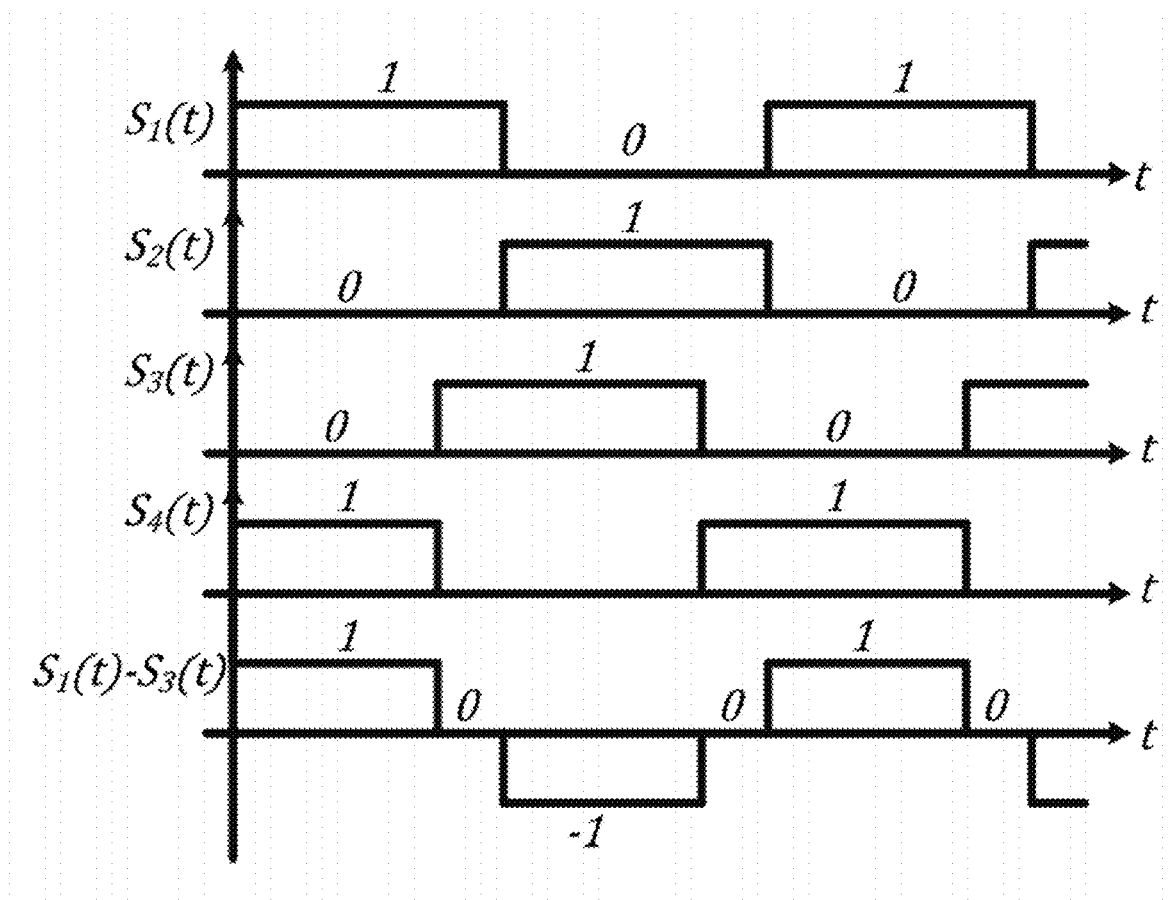
FIG. 8 shows the switching pulses of the power switches in the DC/DC converter when the invention is implemented.

Because the system is observable, the adaptive observer introduced in the present invention is given by:

$$\dot{\hat{x}}_1 = \frac{1}{L_s}v_{AB} - \frac{1}{L_s}\hat{x}_2 - \frac{1}{L_s}\text{sign}(\hat{x}_1)x_3 + \mu_1\tilde{x}_3 \quad (6)$$

$$\dot{\hat{x}}_2 = \frac{1}{C_s}\hat{x}_1 + \mu_2\tilde{x}_3 \quad (7)$$

$$\dot{\hat{x}}_3 = \frac{1}{C_{BUS}}|\hat{x}_1| - \hat{\beta}x_3 + \mu_3\tilde{x}_3 \quad (8)$$

$$\dot{\hat{\beta}} = \gamma x_3 \tilde{x}_3 \quad (9)$$

$$\hat{i}_{in} = \hat{x}_1 \text{sign}(v_{AB}) \quad (10)$$

$$\hat{i}_{PV} = LPF(\hat{i}_{in}) \quad (11)$$

where the coefficients $\mu_1$, $\mu_2$, $\mu_3$, $\gamma$ are the observer gains. FIG. 7 shows the current observer for the output current of PV panel. In FIG. 7, $S_1(t)$ and $S_3(t)$ are the switching pulses for power switch $S_1$ and $S_3$ respectively. It should be noted that the circuit in FIG. 7 merely implements Eqn. (6)-Eqn. (11) above. The switching pulses of the power switches in the DC/DC converter are illustrated in FIG. 8 for clarity. Also, in FIG. 7, sgn represents the sign function (i.e. for the sgn function, if the input is positive the output of the sgn function is +1, if the input is negative the output of the sgn function is −1, and if the input is zero the output of the sgn function is 0), LPF represents a generic low pass filter.

It should be noted that there are a few subtleties in the digital implementation of the observer of the present invention. One of the main subtleties stems from the fact that the observer subsystem is nonlinear. Because of this, special attention should be paid to discretizing the observer in order to accurately estimate the output current of the PV panel. The digital observer introduced in the present invention can be represented by the following difference equations:

$$\hat{x}_1(k) = \hat{x}_1(k-1) + \quad (12)$$
$$\frac{T_k}{2L_s}(v_{AB}(k) + v_{AB}(k-1)) - \frac{T_k}{2L_s}(\hat{x}_2(k) + \hat{x}_2(k-1)) -$$
$$\frac{T_k}{2L_s}\text{sign}\left(\frac{\hat{x}_1(k) + \hat{x}_1(k-1)}{2}\right)x_3(n) + \frac{\mu_1 T_k}{2}(\tilde{x}_3(k) + \tilde{x}_3(k-1))$$

$$\hat{x}_2(k) = \hat{x}_2(k-1) + \frac{T_k}{2C_s}(\hat{x}_1(k) + \hat{x}_1(k-1)) + \frac{\mu_2 T_k}{2}(\tilde{x}_3(k) + \tilde{x}_3(k-1)) \quad (13)$$

$$\hat{x}_3(k) = \hat{x}_3(k-1) + \frac{T_k}{2C_{BUS}}|\hat{x}_1(k) + \hat{x}_1(k-1)| - \quad (14)$$
$$\frac{T_k}{2}x_3(n)(\hat{\beta}(k) + \hat{\beta}(k-1)) + \frac{\mu_3 T_k}{2}(\tilde{x}_3(k) + \tilde{x}_3(k-1))$$

$$\hat{\beta}(k) = \hat{\beta}(k-1) + \frac{T_k \gamma}{2}x_3(n)(\tilde{x}_3(k) + \tilde{x}_3(k-1)) \quad (15)$$

$$\hat{i}_{in}(k) = \hat{x}_1(k)\text{sign}(v_{AB}(k)) \quad (16)$$

$$\hat{i}_{PV}(k) = \frac{1}{N}\sum_{i=0}^{i=N-1}\hat{i}_{in}(k-i) \quad (17)$$

Figure 9:
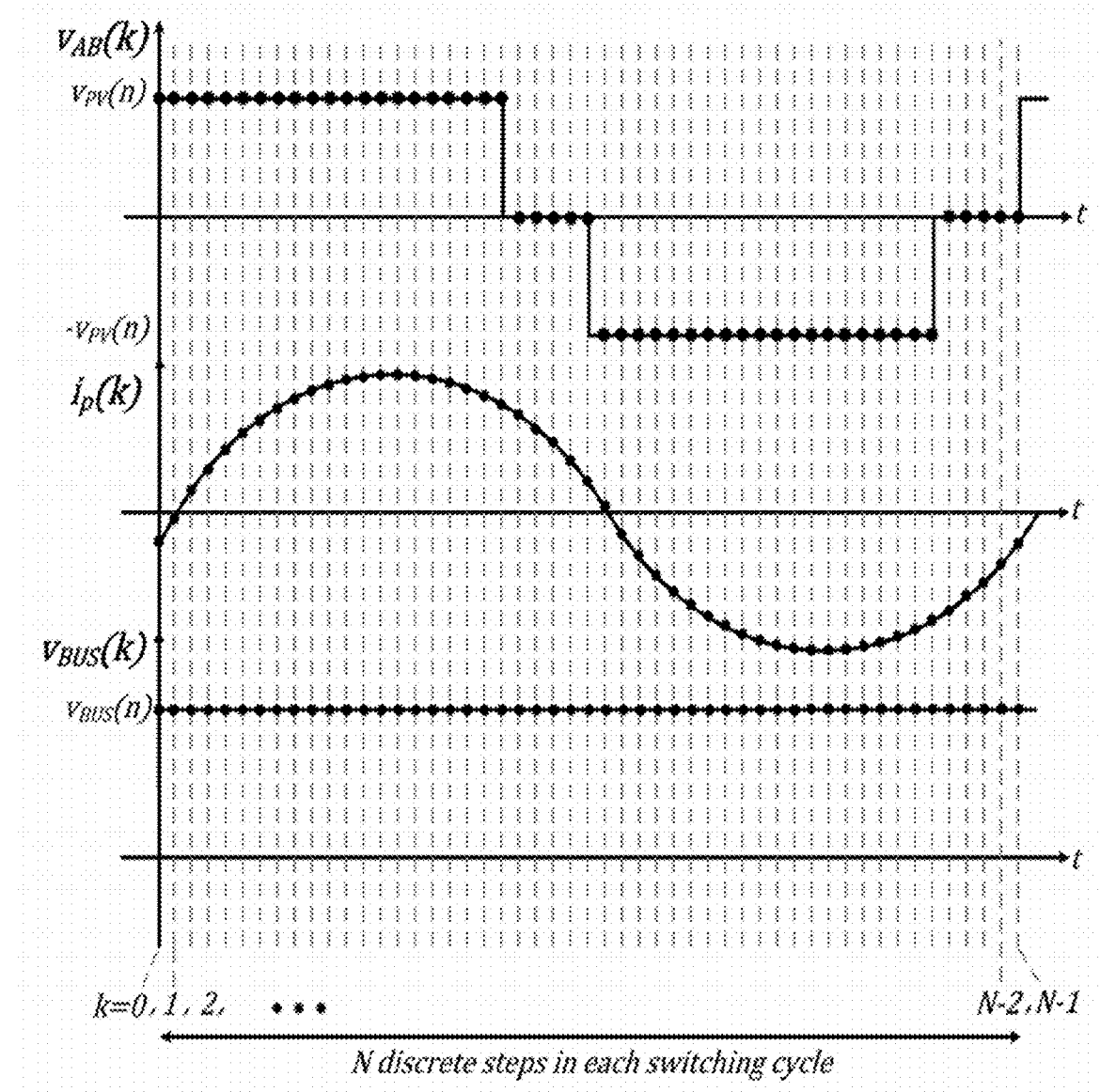
FIG. 9 shows the step size for the discrete calculation of the digital observer in each switching cycle.

Another subtlety relates to the sampling frequency for the DC-bus voltage, $v_{BUS}$, the PV panel output voltage, $v_{PV}$, and the step size for the digital observer calculations. It should be noted that the series resonant current, $x_1$ is a nearly sinusoidal current with the same frequency as the inverter output voltage, $v_{AB}$. Because of this, the observer difference equations must be calculated in a much finer step size than the switching frequency so that one may precisely estimate the series inductor current. FIG. 9 shows the step size for the discrete calculation of the digital observer in each switching cycle. FIG. 9 shows that the step size should be much finer than the switching period in order to achieve precise calculation of the series resonant current. Also, the sampling frequency of the DC-bus voltage and the output voltage of the PV panel is much coarser than the step size of the discrete observer calculation (usually once or a few times for each switching cycle). This is the reason that the discrete value of the DC-bus voltage $v_{BUS}(n)$ and the PV output voltage $v_{PV}(n)$ has an argument different from the step size k.

Figure 10:
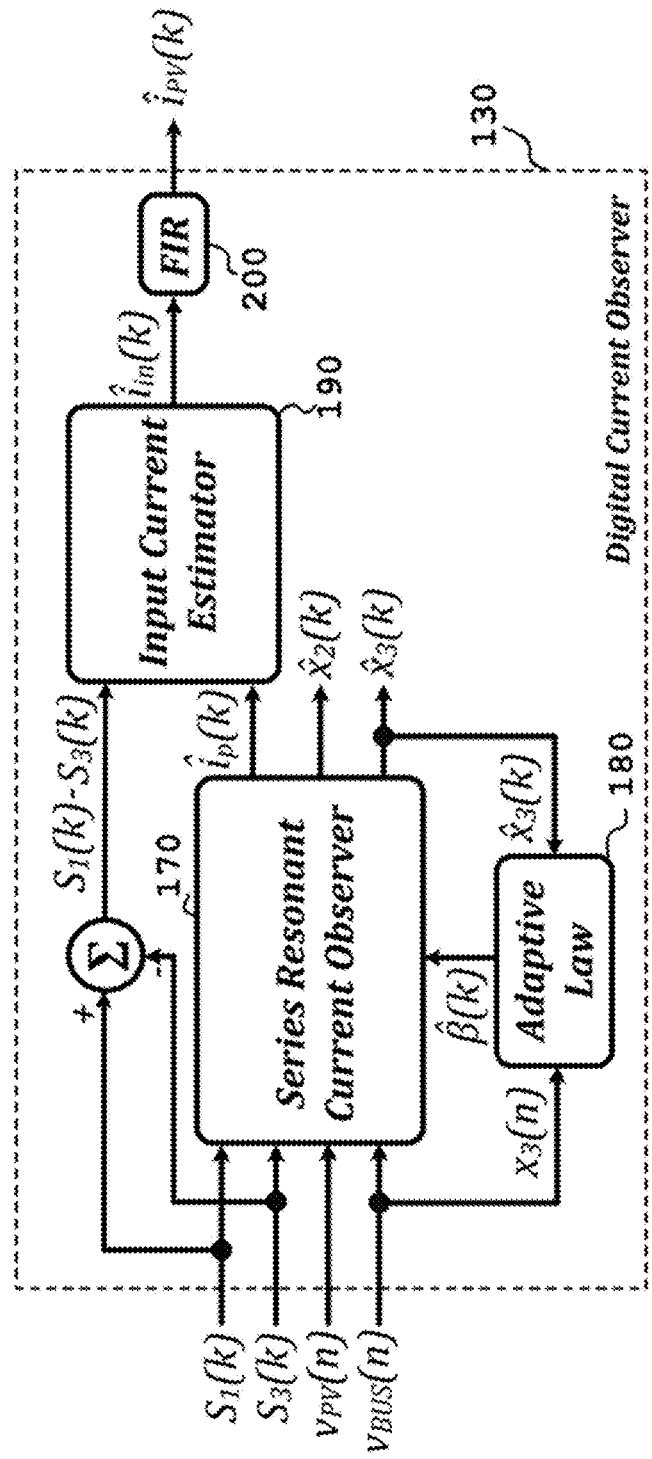
FIG. 10 shows the block diagram of the current observer for the output current of the PV panel.
Figure 11:
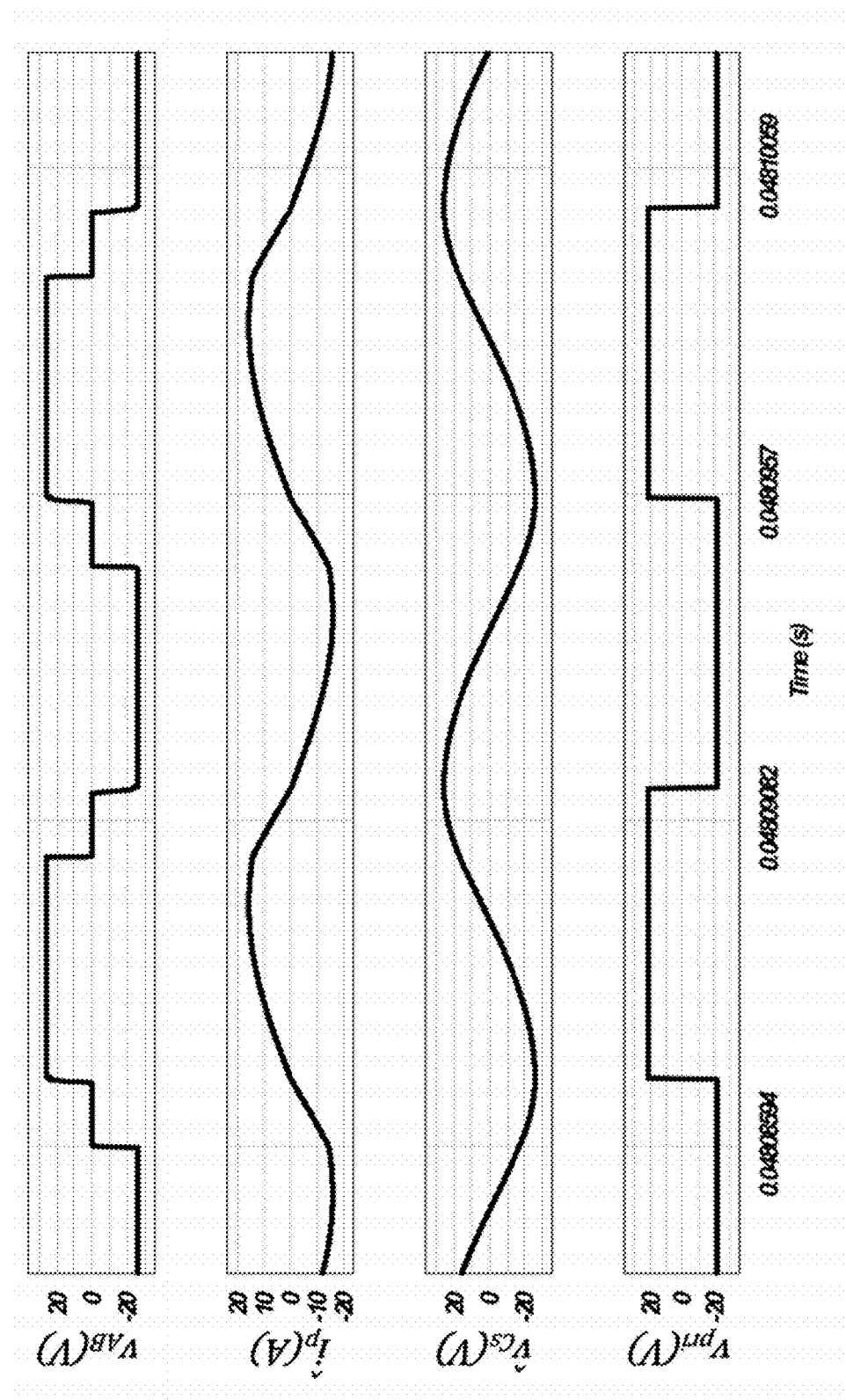
FIG. 11 show various simulation waveforms for the DC/DC converter using one aspect of the invention.

The estimated series inductor current $\hat{x}_1(k)$ and the switching pattern of the full-bridge inverter, in particular $S_1(t)$-$S_3(t)$, determines the input current of the series resonant converter, $\hat{i}_{in}(k)$. Finally, the estimated PV panel output current, $\hat{i}_{PV}$ is the DC-value of the estimated input current of the converter. FIG. 10 shows the block diagram of the current observer for the output current of the PV panel. FIG. 10 shows the digital current observer 130, which includes: series resonant current observer 170, adaptive law 180, input current estimator 190, and finite impulse response (FIR) filter 200. The series resonant current observer 170 estimates the series resonant current $\hat{i}_p(k)$ as the main output. The other outputs are the estimated series capacitor voltage, $\hat{x}_2(k)$, and the estimated DC-bus voltage, $\hat{x}_3(k)$. The inputs to the series resonant current observer 170 are the switching signals $S_1(k)$ and $S_3(k)$, the sampled PV panel output voltage, $v_{PV}(n)$, the sampled DC-bus voltage $v_{BUS}(n)$, and the parameter $\hat{\beta}(k)$. The series resonant current observer 170 implements Eqn. (12), Eqn. (13), and Eqn. (14). The adaptive law 180 implements Eqn. (15). The adaptive law 180 estimates the parameter $\hat{\beta}(k)$ as the output using the sampled DC-bus voltage $v_{BUS}(n)$ and the estimated DC-bus voltage $\hat{x}_3(k)$ as the inputs. The input current estimator 190 implements Eqn. (16). The input current estimator 190 receives the estimated series resonant current, $\hat{i}_p(k)$, and the switching signals, $S_1(k)$-$S_3(k)$, as the inputs and produces the estimated input current $\hat{i}_{in}(k)$ as the output. The FIR 200 implements Eqn. (17). Eqn. (17) represents the simplest form of an FIR filter. However, any appropriately designed FIR can be used to extract the DC-value of the estimated input current $\hat{i}_{in}(k)$. The FIR 200 receives the estimated input current $\hat{i}_{in}(k)$ as the input and produces the estimated PV panel output current $\hat{i}_{PV}(k)$ as the output.

Figure 12:
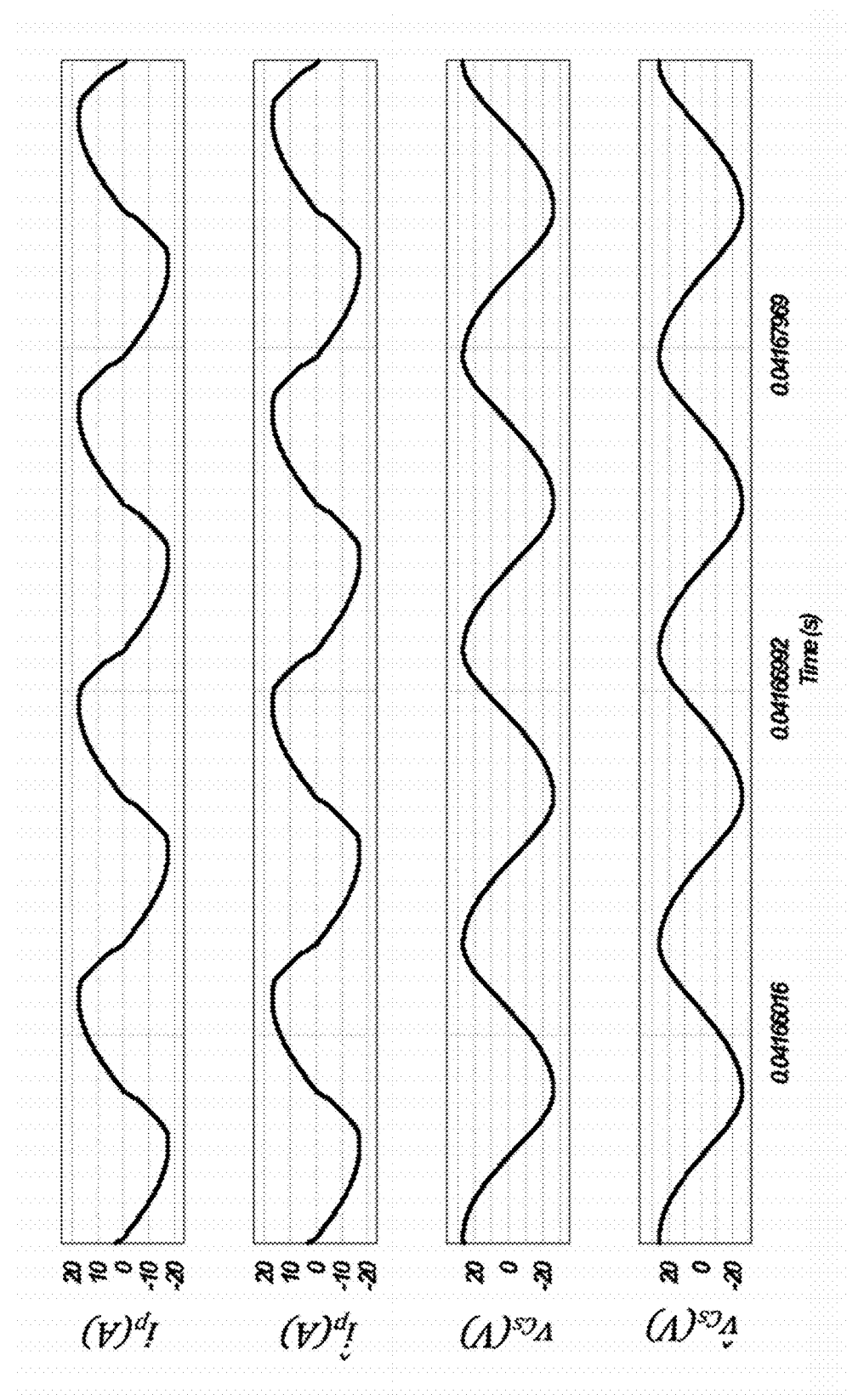
FIG. 12 show further waveforms illustrating the accuracy of the observer according to one aspect of the invention.
Figure 13:
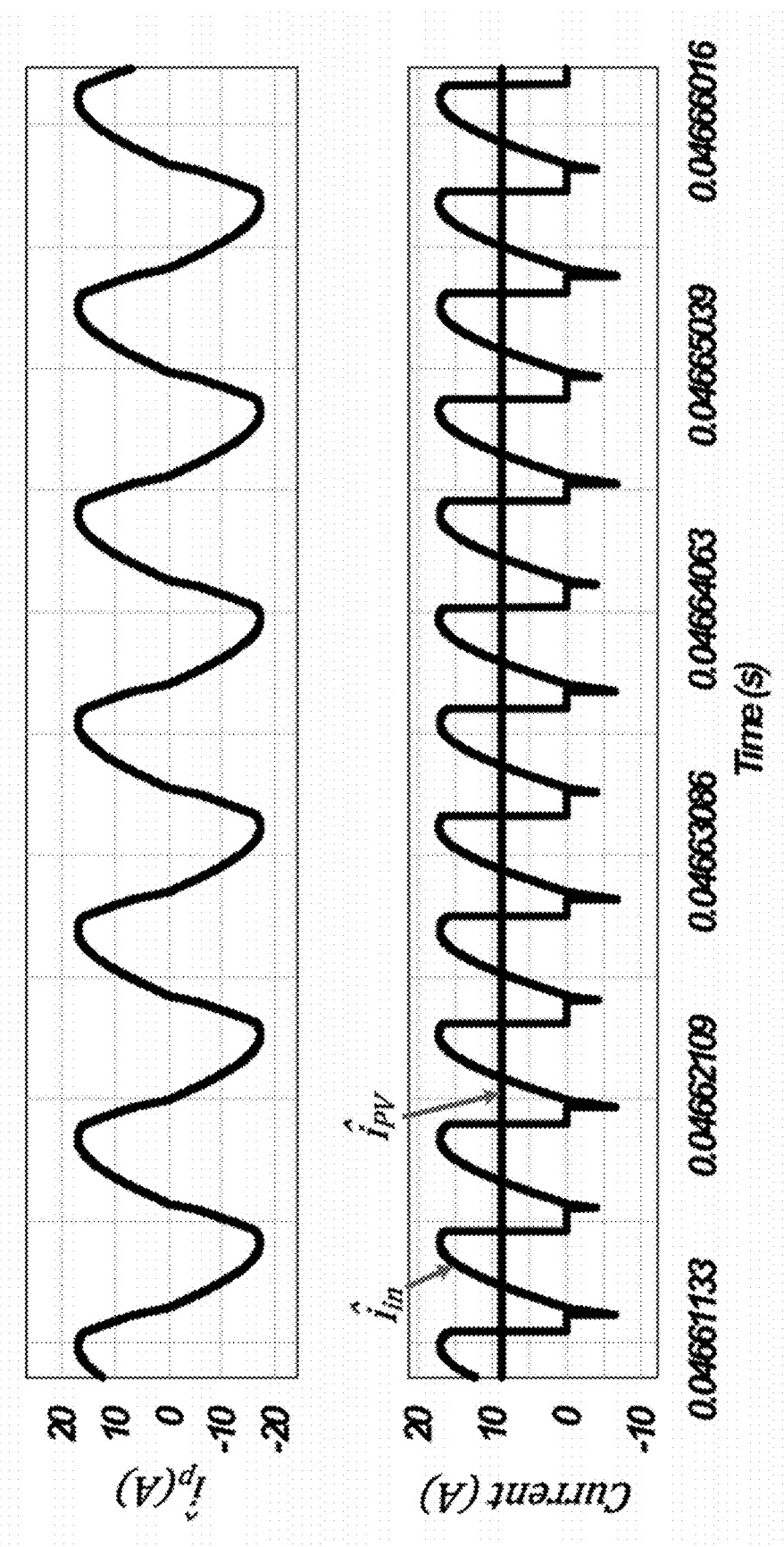
FIG. 13 illustrate various waveforms which show that the observer of the invention is able to accurately estimate the output current of the PV panel.
Figure 14:
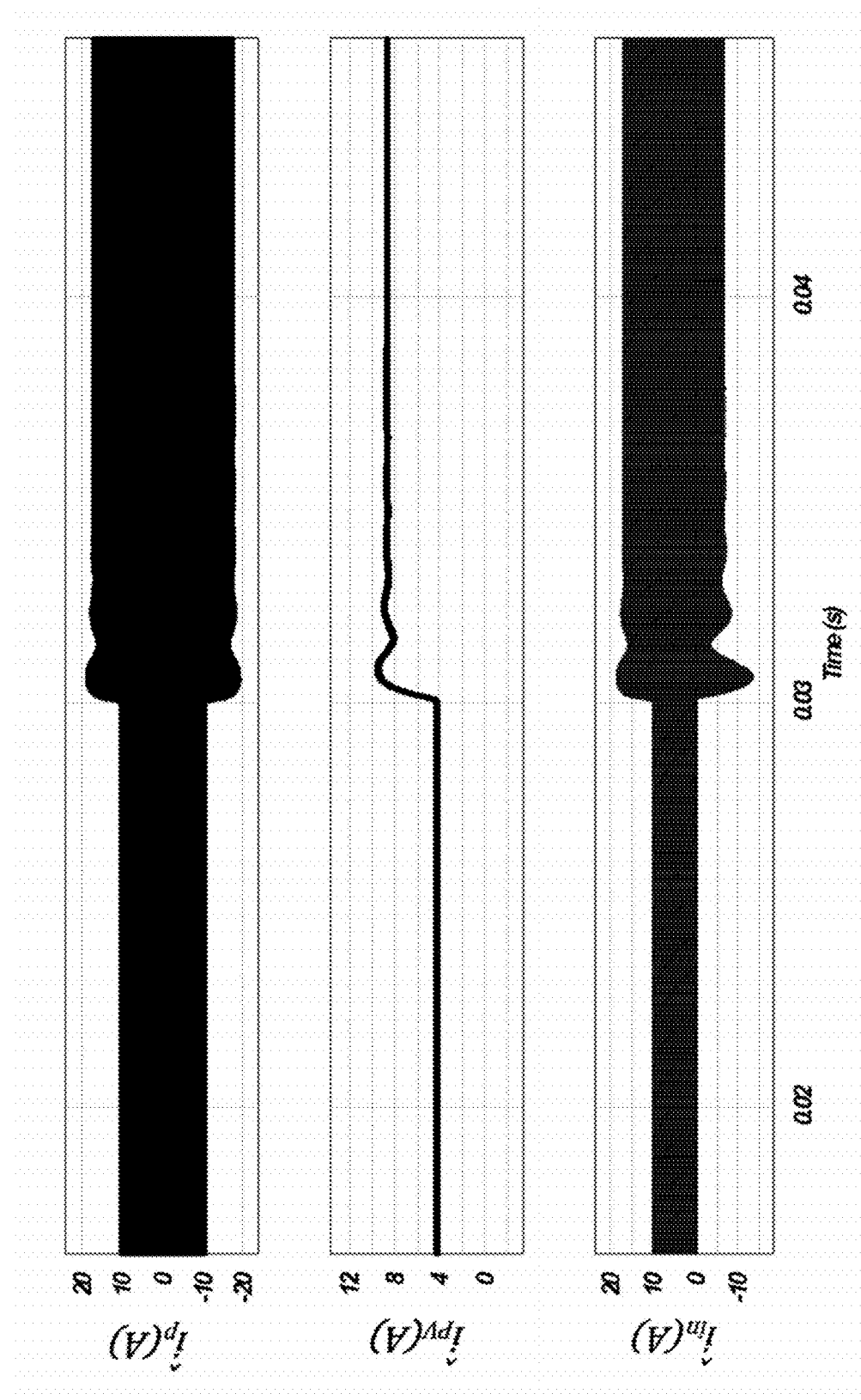
FIG. 14 illustrates the transient performance of the closed loop control system.

Simulation waveforms of the DC/DC converter with the current sensorless MPPT are shown in FIG. 11, FIG. 12, FIG. 13, and FIG. 14. The waveforms in FIG. 11 include: the inverter output voltage, $v_{AB}$, the estimated series resonant current, $\hat{i}_p$, the estimated series capacitor voltage, $\hat{v}_{Cs}$, and the transformer primary voltage, $v_{pri}$. Referring to FIG. 12, illustrated are: the actual series resonant current, $i_p$, the estimated series resonant current, $\hat{i}_p$, the actual series capacitor voltage, $v_{Cs}$, and the estimated series capacitor voltage $\hat{v}_{Cs}$. FIG. 12 shows the accuracy of the observer according to one aspect of the invention. FIG. 13 shows the estimated series resonant current, $\hat{i}_p$, the estimated converter input current, $\hat{i}_{in}$ and the estimated PV output current, $\hat{i}_{PV}$. FIG. 13 shows that the observer according to one aspect of the invention is able to accurately estimate the output current of the PV panel. The transient performance of the closed loop control system is illustrated in FIG. 14. Referring to FIG. 14 illustrated are: the transient performance of the estimated series resonant current, $\hat{i}_p$, the estimated PV output current, $\hat{i}_{PV}$, and the estimated converter input current, $\hat{i}_{in}$.

Figure 15:
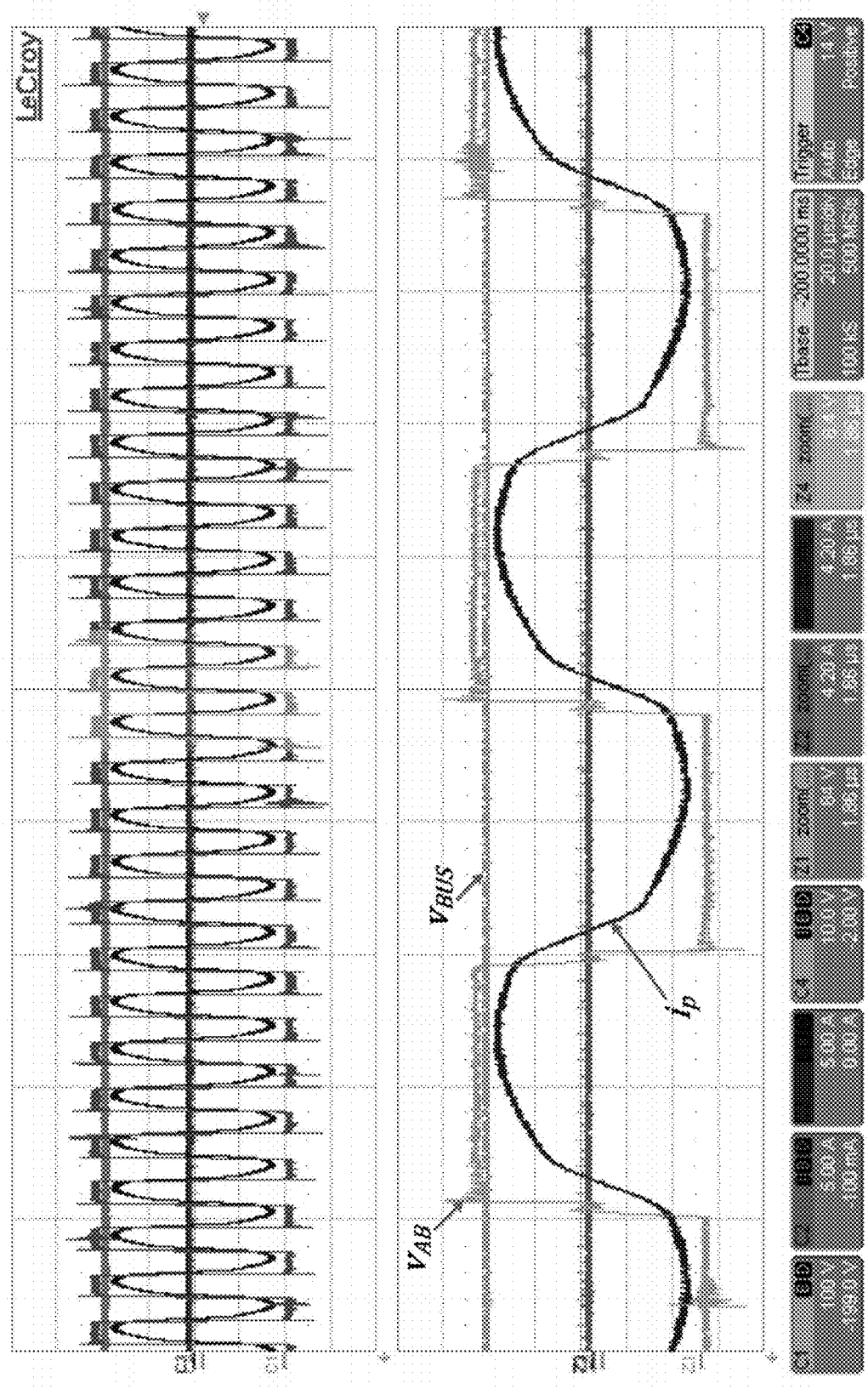
FIG. 15 shows the steady-state performance of the prototype converter using the invention.
Figure 16:
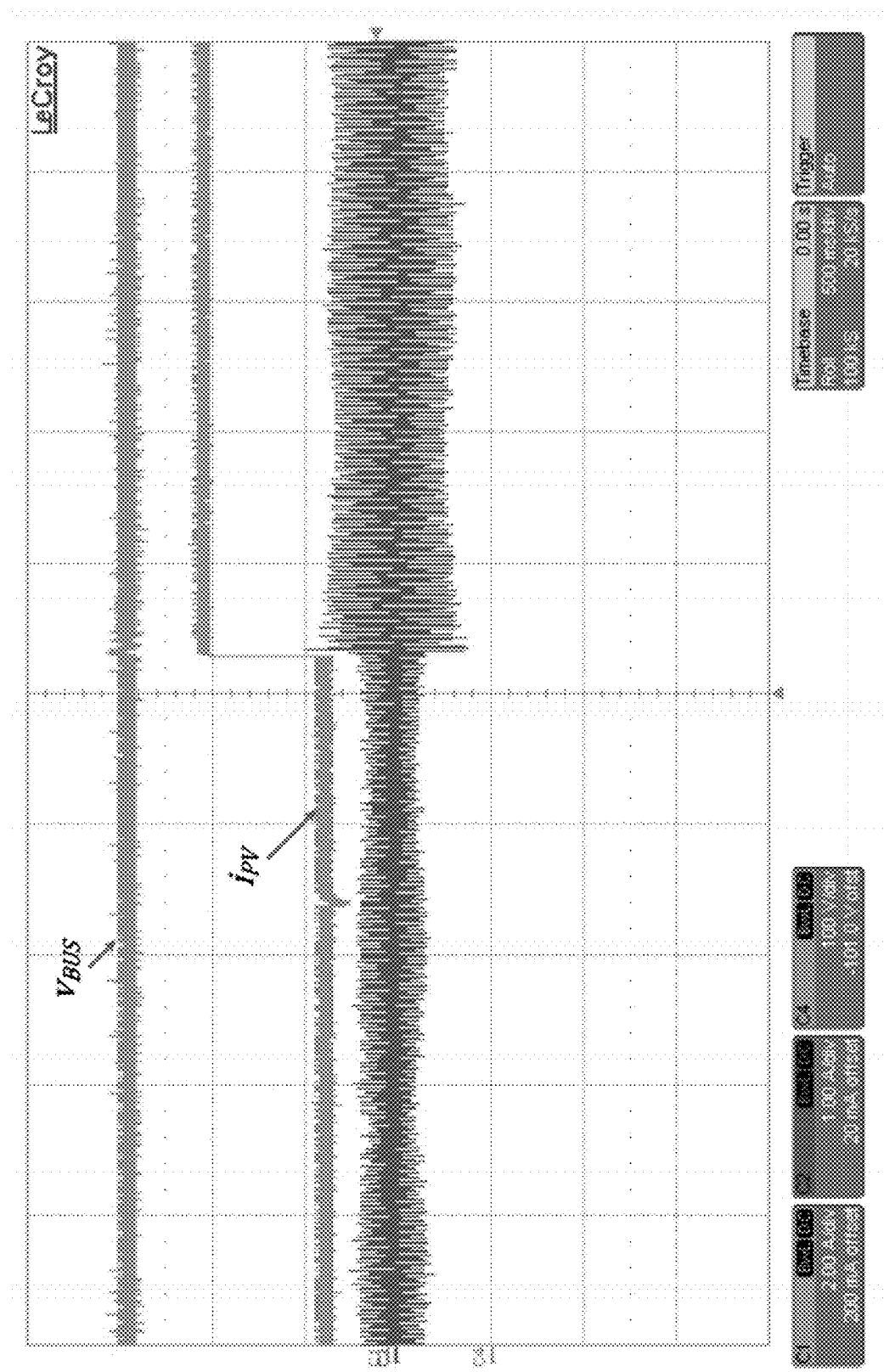
FIG. 16 illustrates the transient performance of the prototype converter using the invention.

Experimental waveforms of the DC/DC converter prototype using the current sensorless MPPT according to one aspect of the present invention are shown in FIG. 15 and FIG. 16. FIG. 15 shows the steady-state performance of the converter and FIG. 16 illustrates the transient performance of the converter.

It should be noted that the observer according to one aspect of the invention may be implemented as an ASIC (application specific integrated circuit). Similarly, the observer may be implemented using a general purpose computer and suitable programming and hardware.

The embodiments of the invention may be executed by a computer processor or similar device programmed in the manner of method steps, or may be executed by an electronic system which is provided with means for executing these steps. Similarly, an electronic memory means such as computer diskettes, CD-ROMs, Random Access Memory (RAM), Read Only Memory (ROM) or similar computer software storage media known in the art, may be programmed to execute such method steps. As well, electronic signals representing these method steps may also be transmitted via a communication network.

Embodiments of the invention may be implemented in any conventional computer programming language. For example, preferred embodiments may be implemented in a procedural programming language (e.g."C") or an object-oriented language (e.g."C++", "java", "PHP", "PYTHON" or "C#"). Alternative embodiments of the invention may be implemented as pre-programmed hardware elements, other related components, or as a combination of hardware and software components.

Embodiments can be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink-wrapped software), preloaded with a computer system (e.g., on system ROM or fixed disk), or distributed from a server over a network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

A person understanding this invention may now conceive of alternative structures and embodiments or variations of the above all of which are intended to fall within the scope of the invention as defined in the claims that follow.

We claim:

1. A control system for controlling a DC/DC converter for a photovoltaic panel, the control system comprising:
   a current estimator for providing an estimated output current of said photovoltaic panel, said current estimator basing said estimated output current on an output voltage of said photovoltaic panel and on a bus voltage of said DC/DC converter;
   a maximum power point tracker (MPPT) for producing a reference value for an output voltage of said photovoltaic panel, said MPPT receiving said estimated output current from said current estimator;
   an input voltage controller for producing a desired phase shift for regulating an input voltage of said DC/DC converter, said input voltage controller receiving said reference value from said MPPT;
   a phase-shift modulator for producing control signals for power switches in said DC/DC converter based on said desired phase shift;
wherein said current estimator is based on nonlinear dynamics of said DC/DC converter.

2. The control system according to claim 1, wherein said estimated output current is the estimated output current of said photovoltaic panel in a DC component of an input current to said DC/DC converter.

3. The control system according to claim 1, wherein said current estimator receives, as inputs, at least two control signals for power switches in a full bridge inverter in said DC/DC converter.

4. The control system according to claim 1, wherein an analog implementation of said current estimator implements $$\dot{\hat{x}}_1 = \frac{1}{L_s} v_{AB} - \frac{1}{L_s} \hat{x}_2 - \frac{1}{L_s} \text{sign}(\hat{x}_1) x_3 + \mu_1 \tilde{x}_3$$

$$\dot{\hat{x}}_2 = \frac{1}{C_s} \hat{x}_1 + \mu_2 \tilde{x}_3$$

$$\dot{\hat{x}}_3 = \frac{1}{C_{BUS}} |\hat{x}_1| - \hat{\beta} x_3 + \mu_3 \tilde{x}_3$$

$$\dot{\hat{\beta}} = \gamma x_3 \tilde{x}_3$$

$$\hat{i}_{in} = \hat{x}_1 \text{sign}(v_{AB})$$

$$\hat{i}_{PV} = LPF(\hat{i}_{in})$$

where,
coefficients $\mu_1, \mu_2, \mu_3, \gamma$ are gains of said current estimator;
$\hat{x}_1$ is an estimated value of $i_p$, $i_p$ being a series resonant current;
$L_s$ is a series inductance;
$V_{AB}$ is an inverter output voltage;
$\hat{x}_2$ is an estimated value of $v_{Cs}$, $v_{Cs}$ being a series capacitor voltage;
sign is a positive/negative signing function;
$x_3 = v_{BUS}$, $v_{BUS}$ being a DC-bus voltage of said DC/DC converter;
$\tilde{x}_3 = x_3 - \hat{x}_3$, $\tilde{x}_3$ being an estimation error of $x_3$, and $\hat{x}_3$ being an estimated value of $x_3$;
$C_s$ is a series capacitance;
$C_{BUS}$ is a DC-bus capacitance;

$$\beta = \frac{1}{C_{BUS} R_e},$$

$R_e$ being a resistance of said converter;
$\hat{\beta}$ is an estimated value of $\beta$;
$\hat{i}_{PV}$ is a DC-value of an estimated input current of said converter;
$i_{in}$ is an actual value of $\hat{i}_{in}$, $\hat{i}_{in}$ being an estimated input current of said converter; and
LPF is a function representing a generic low-pass filter.

5. The control system according to claim 1, wherein a digital implementation of said current estimator can be represented by difference equations:

$$\hat{x}_1(k) = \hat{x}_1(k-1) + \frac{T_k}{2L_s}(v_{AB}(k) + v_{AB}(k-1)) - \frac{T_k}{2L_s}(\hat{x}_2(k) + \hat{x}_2(k-1)) -$$
$$\frac{T_k}{2L_s} \text{sign}\left(\frac{\hat{x}_1(k) + \hat{x}_1(k-1)}{2}\right) x_3(n) + \frac{\mu_1 T_k}{2}(\tilde{x}_3(k) + \tilde{x}_3(k-1))$$

$$\hat{x}_2(k) = \hat{x}_2(k-1) + \frac{T_k}{2C_s}(\hat{x}_1(k) + \hat{x}_1(k-1)) + \frac{\mu_2 T_k}{2}(\tilde{x}_3(k) + \tilde{x}_3(k-1))$$

$$\hat{x}_3(k) = \hat{x}_3(k-1) + \frac{T_k}{2C_{BUS}}|\hat{x}_1(k) + \hat{x}_1(k-1)| -$$
$$\frac{T_k}{2} x_3(n)(\hat{\beta}(k) + \hat{\beta}(k-1)) + \frac{\mu_3 T_k}{2}(\tilde{x}_3(k) + \tilde{x}_3(k-1))$$

$$\hat{\beta}(k) = \hat{\beta}(k-1) + \frac{T_k \gamma}{2} x_3(n)(\tilde{x}_3(k) + \tilde{x}_3(k-1))$$

$$\hat{i}_{in}(k) = \hat{x}_1(k) \text{sign}(v_{AB}(k))$$

$$\hat{i}_{PV}(k) = \frac{1}{N} \sum_{i=0}^{i=N-1} \hat{i}_{in}(k-i)$$

where,
coefficients $\mu_1, \mu_2, \mu_3, \gamma$ are gains of said current estimator;
$\hat{x}_1$ (k) is an iterative estimated value of $i_p$, $i_p$ being a series resonant current;
$L_s$ is a series inductance;
$v_{AB}$ (k) is an iterative inverter output voltage;
$\hat{x}_2$ (k) is an iterative estimated value of $v_{Cs}$, $v_{Cs}$ being a series capacitor voltage;
$T_k$ is a switching cycle,
sign is a positive/negative signing function;
$x_3$ (k)=$v_{BUS}$ (k), $v_{BUS}$ (k) being an iterative DC-bus voltage of said DC/DC converter;
$\tilde{x}_3$ (k)=$x_3$ (k)–$\hat{x}_3$ (k), $\tilde{x}_3$(k) being an iterative estimation error of $x_3$ (k), and $\hat{x}_3$ (k) being an iterative estimated value of $x_3$ (k);
$C_{BUS}$ is a DC-bus capacitance;
$\hat{\beta}$ (k) is an iterative estimated value of $\beta$;
$\hat{i}_{PV}$ (k) is a DC-value of an iterative estimated input current of said converter; and
$\hat{i}_{in}$ (k) is an iterative estimated input current of said converter,
k is a step size,
n is a sampling value discrete from k, and
N is a number of discrete steps in said switching cycle.

6. The control system according to claim 3, wherein a digital implementation of said current estimator comprises:
   a series resonant current observer receiving said at least two control signals, said output voltage of said photovoltaic panel, and said bus voltage of said DC/DC converter;
   an adaptive law block for calculating a coefficient used by said series resonant current observer based on a sensed bus voltage and on an estimate bus voltage;
   an input current estimator receiving a difference between said at least two control signals and estimated current from said series resonant current observer;

a finite impulse response filter receiving an output of said input current estimator, said finite impulse response filter producing an output of said current estimator.

\* \* \* \* \*